(12) United States Patent
Tsuda

(10) Patent No.: US 9,157,948 B2
(45) Date of Patent: Oct. 13, 2015

(54) SEMICONDUCTOR DEVICE AND FAULT DIAGNOSIS SYSTEM

(71) Applicant: Renesas Electronics Corporation, Kawasaki-shi, Kanagawa (JP)

(72) Inventor: Kazutoshi Tsuda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 307 days.

(21) Appl. No.: 13/912,474

(22) Filed: Jun. 7, 2013

(65) Prior Publication Data
US 2014/0009185 A1 Jan. 9, 2014

(30) Foreign Application Priority Data
Jul. 5, 2012 (JP) .................................. 2012-150986

(51) Int. Cl.
G01R 31/02 (2006.01)
G01R 31/26 (2014.01)
H03M 1/10 (2006.01)
H03M 3/00 (2006.01)
H03M 1/12 (2006.01)

(52) U.S. Cl.
CPC ............. G01R 31/26 (2013.01); H03M 1/1076 (2013.01); H03M 3/378 (2013.01); H03M 1/12 (2013.01); H03M 3/458 (2013.01)

(58) Field of Classification Search
CPC .. G01R 19/2513; G01R 21/003; G01R 29/26; G01R 31/31725; G01R 35/005; G01R 31/26; H03M 3/378
See application file for complete search history.

(56) References Cited

U.S. PATENT DOCUMENTS

| | | | | |
|---|---|---|---|---|
| 6,239,586 B1 * | 5/2001 | Fawcett et al. | ............. | 324/76.65 |
| 7,427,936 B2 | 9/2008 | Takeuchi | | |
| 7,578,282 B2 * | 8/2009 | Honda | ...................... | 123/406.34 |
| 7,696,910 B2 | 4/2010 | Koyama | | |

FOREIGN PATENT DOCUMENTS

| | | |
|---|---|---|
| JP | 2003-177161 A | 6/2003 |
| JP | 2007-300469 A | 11/2007 |
| JP | 2008-252520 A | 10/2008 |

* cited by examiner

*Primary Examiner* — Tung X Nguyen
(74) *Attorney, Agent, or Firm* — Sughrue Mion, PLLC

(57) ABSTRACT

Provided is a semiconductor device capable of performing fault detection on a circuit executing an AD conversion operation during the AD conversion operation. The semiconductor device includes an analog to digital conversion unit that converts a second analog signal into a first digital signal, in which the second analog signal is obtained by adding a first analog signal and an offset signal with a signal band different from the first analog signal, a signal extraction unit that extracts from the first digital signal a second digital signal corresponding to the signal band of the offset signal, and a fault detection unit that detects a fault in the analog to digital conversion unit based on the second digital signal and a setting value that is set upon generating the offset signal.

19 Claims, 12 Drawing Sheets

SEMICONDUCTOR DEVICE AND FAULT DIAGNOSIS SYSTEM

CROSS-REFERENCE TO RELATED APPLICATIONS

This application is based upon and claims the benefit of priority from Japanese patent application No. 2012-150986, filed on Jul. 5, 2012, the disclosure of which is incorporated herein in its entirety by reference.

BACKGROUND

The present invention relates to a semiconductor device and is favorably used to a semiconductor device including an analog to digital converter, for example.

When an AD (Analog to Digital) converter is used for uses that require functional safety, it has been requested to perform fault detection on the AD converter so as to validate conversion data. It has also been requested to perform the fault detection on a digital sigma AD converter that is used for highly precise measurement use.

Japanese Unexamined Patent Application Publication No. 2007-300469 discloses fault detection on an AD conversion device using signals output from a sampling amplifier, which is a circuit disposed in a preceding stage of a comparison unit, in a comparison period in which the comparison unit is executing AD conversion, where a cycle of the AD conversion is divided into an initialization period, a sampling period, and the comparison period. The initialization period indicates a period from a start timing of the AD conversion to an initialization end timing. The sampling period indicates a period from the initialization end timing to a sampling end timing. The comparison period indicates a period from the sampling end timing to the start timing of a next AD conversion process.

Japanese Unexamined Patent Application Publication No. 2003-177161 discloses a configuration of a test device that includes a signal processing unit for converting a signal added with a dither signal into a digital signal and evaluates normality of an electronic device by comparing the digital signal output from the signal processing unit with an expected value. The dither signal is used to reduce quantization error in AD conversion.

Japanese Unexamined Patent Application Publication No. 2008-252520 discloses a configuration of a dither generation circuit that generates a plurality of square waves each with different frequencies.

SUMMARY

Fault detection on the AD conversion device disclosed in Japanese Unexamined Patent Application Publication No. 2007-300469 is performed using the signals output from the sampling amplifier, which is the circuit disposed in the preceding stage of the comparison unit. That is, the technique disclosed in Japanese Unexamined Patent Application Publication No. 2007-300469 merely performs the fault detection on the sampling amplifier in the period between the sampling end timing and the start timing of the next AD conversion process in the AD conversion device. Accordingly, the present inventor has found a problem in the fault detection on the AD conversion device disclosed in Japanese Unexamined Patent Application Publication No. 2007-300469 that the fault detection cannot be performed on the comparison unit that performs the AD conversion process during an AD conversion operation. However, in order to ensure high reliability of the AD conversion device, it has been desired to perform the fault detection on the circuit corresponding to the comparison unit that executes the AD conversion process during the AD conversion operation. Neither patent literature 2 nor 3 discloses means to solve such a problem. Other issues and new features will be addressed in the description of this specification and attached drawings.

An aspect of the present invention is a semiconductor device including an analog to digital conversion unit that converts an analog signal added with an offset signal into a digital signal, a signal extraction unit that extracts an offset signal component from the digital signal, and a fault detection unit that detects a fault in the analog to digital conversion unit based on the extracted offset signal component.

According to the above embodiment, it is possible to perform the fault detection on the circuit that is performing the AD conversion process during the AD conversion operation.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
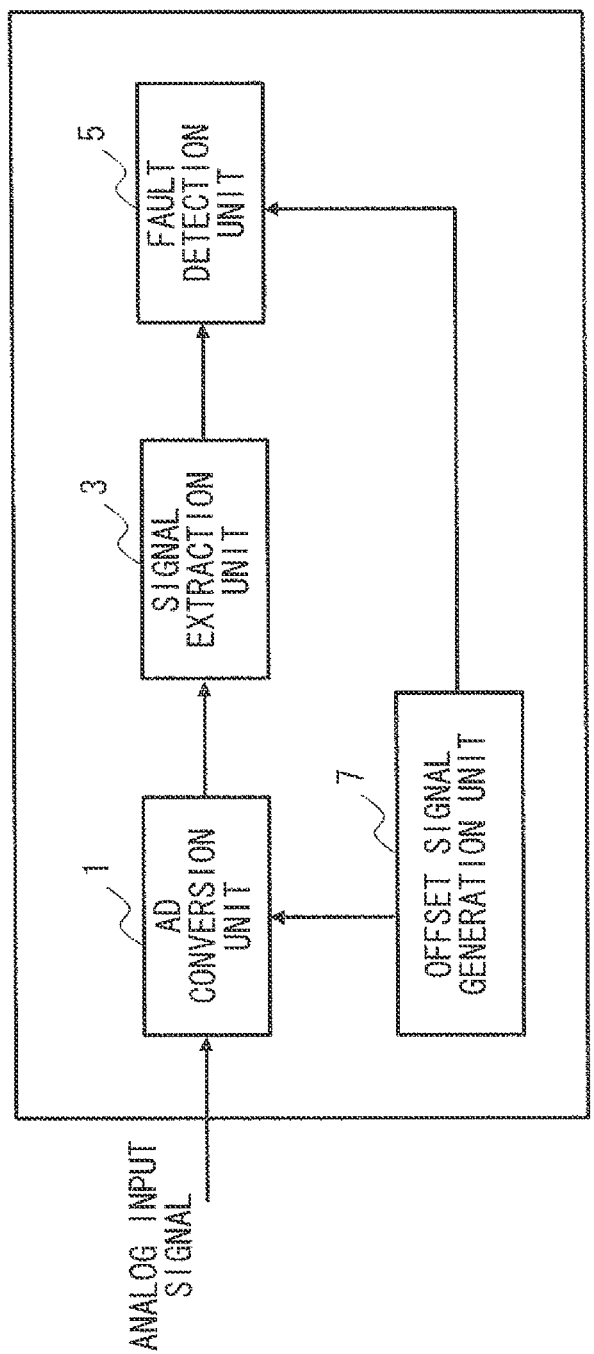
FIG. 1 is a block diagram of a semiconductor device according to a first embodiment.

Hereinafter, embodiments of the present invention are explained with reference to the drawings. A configuration example of a semiconductor device according to a first embodiment is explained using FIG. 1. The semiconductor device includes an AD conversion unit 1, a signal extraction unit 3, a fault detection unit 5, and an offset signal generation unit 7.

The AD conversion unit 1 converts an analog input signal into a digital signal. The AD conversion unit 1 receives the analog input signal and an offset signal. The analog input signal is output from another semiconductor device or analog processing circuit, for example. Alternatively, the analog input signal may be a wireless signal received via an antenna and the like. The offset signal generation unit 7 generates the offset signal. The offset signal is used to reduce quantization error in the AD conversion unit 1. For example, a dither signal, a fixed signal having fixed amplitude, or a pseudo-random signal may be used as the offset signal. The dither signal is generally used as a measure to address the issue of idle tones. Moreover, the offset signal has a different signal band from the analog input signal that is input to the AD conversion unit 1. In other words, a frequency band different from the analog input signal is set to the offset signal.

The AD conversion unit 1 converts an added analog signal, which is obtained by adding the analog input signal and the offset signal, into a digital signal.

The signal extraction unit 3 extracts an offset digital signal corresponding to the signal band of the offset signal from the digital signal generated in the AD conversion unit 1. For example, the signal extraction unit 3 may extract the offset digital signal using a digital filter that passes only the frequency band in which the offset signal operates. For example, a low-pass filter (LPF) or a high-pass filter (HPF) may be used as the digital filter.

The fault detection unit 5 evaluates whether or not a fault is present in the AD conversion unit 1 based on the offset digital signal and a setting value that is used to generate the offset signal input to the AD conversion unit 1. The offset digital signal used for fault evaluation is a signal extracted by the signal extraction unit 3. The setting value used to generate the offset signal is a setting value used by the offset signal generation unit 7. For example, the setting value is an amplitude value at a predetermined timing. The offset signal generation unit 7 generates the offset signal, which is an analog signal, using the setting value.

For example, the fault detection unit 5 compares the offset digital signal with the setting value. Further, when a comparison result indicates a match, the fault detection unit 5 may evaluate that no fault is present, while when the comparison result indicates no match, the fault detection unit 5 may evaluate that a fault is present. Even when the comparison result indicates no match, if a difference between the offset signal and the setting value is within a predetermined range, the fault detection unit 5 may evaluate that no fault is present.

As explained above, the semiconductor device of FIG. 1 can extract the offset digital signal corresponding to the signal band of the offset signal from the digital signal output from the AD conversion unit 1. Extraction of the offset digital signal is performed in parallel to an AD conversion operation. Therefore, the fault detection unit 5 can perform fault evaluation on the AD conversion unit 1 during the AD conversion operation.

Figure 2:
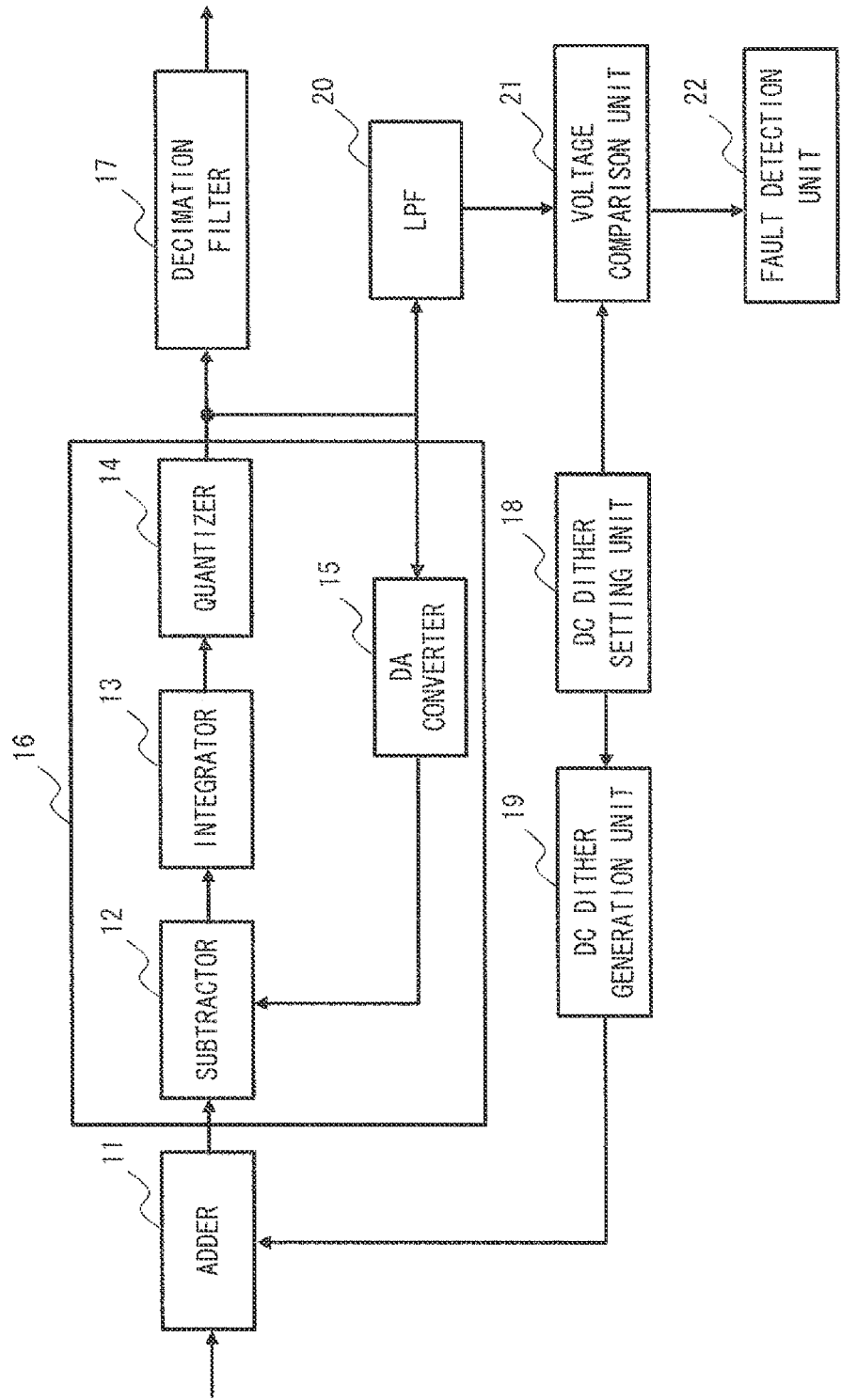
FIG. 2 is a block diagram of the semiconductor device according to the first embodiment.

Next, a specific configuration example of the semiconductor device is explained using FIG. 2. The semiconductor device of FIG. 2 includes an adder 11, a delta-sigma AD converter 16, a decimation filter 17, a DC dither setting unit 18, a DC dither generation unit 19, an LPF 20, a voltage comparison unit 21, and a fault detection unit 22. The delta-sigma AD converter 16 includes a subtractor 12, an integrator 13, a quantizer 14, and a DA converter 15.

Figure 3:
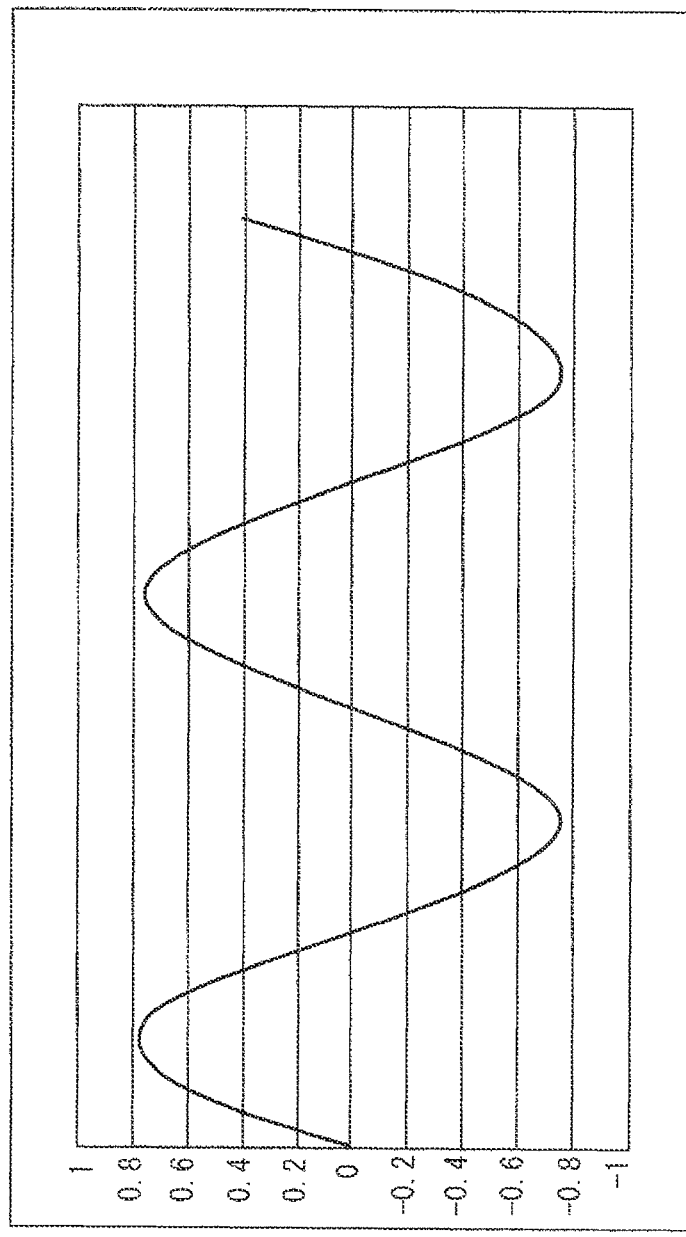
FIG. 3 is a waveform chart of an analog input signal according to the first embodiment.
Figure 4:
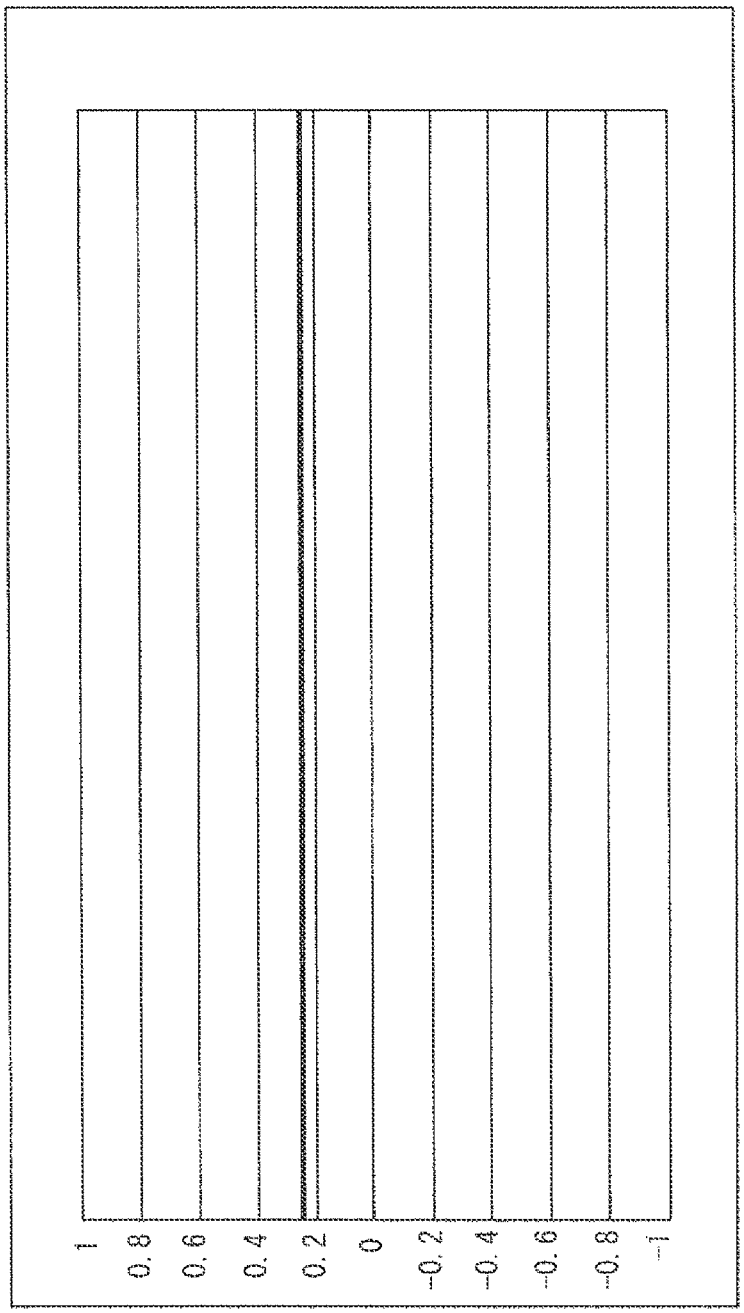
FIG. 4 is a waveform chart of a DC dither signal according to the first embodiment.

The adder 11 adds the analog input signal and a DC dither signal and generates an added analog signal. FIG. 3 shows an example of the analog input signal supplied to the adder 11. The analog signal of FIG. 3 is an alternating current signal. A sine wave may be used for the alternating current signal, as shown in FIG. 3. FIG. 4 shows an example of the DC dither signal input to the adder 11. The DC dither signal of FIG. 4 is a direct current signal. The DC dither signal is a direct current signal indicating a certain voltage value. The voltage value set to the DC dither signal is determined by the DC dither setting unit 18. Further, the DC dither generation unit 19 generates the DC dither signal using the setting value determined by the DC dither setting unit 18. The DC dither generation unit 19 outputs the generated DC dither signal to the adder 11.

Figure 5:
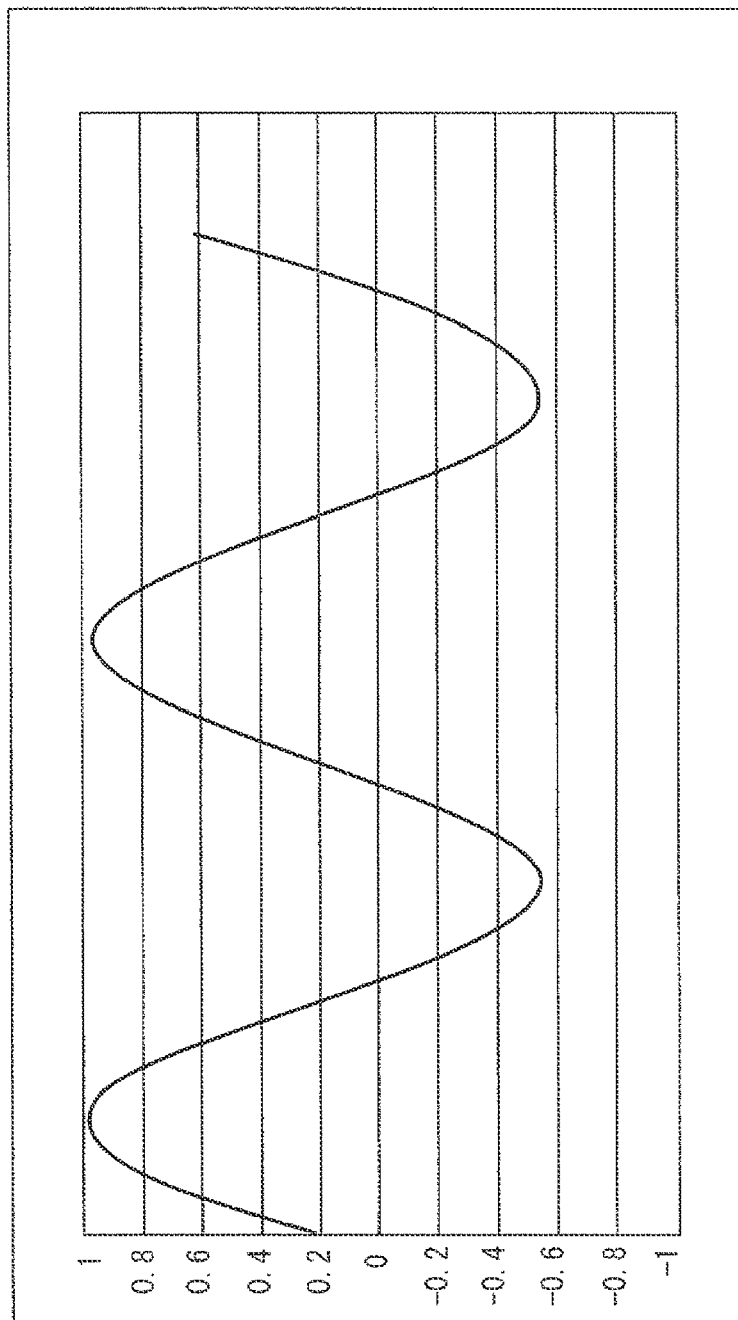
FIG. 5 is a waveform chart of an added analog signal according to the first embodiment.

FIG. 5 shows an example of the added analog signal generated by the adder 11. The added analog signal of FIG. 5 indicates that a certain value is added to the analog input signal of FIG. 3. The adder 11 outputs the added analog signal to the delta-sigma AD converter 16.

The delta-sigma AD converter 16 converts the added analog signal output from the adder 11 into a digital signal. The DC dither signal added by the adder 11 is used to increase an apparent input signal when a small signal with small amplitude is input to the delta-sigma AD converter 16. Adding the DC dither signal to the small signal can suppress the phenomenon in which the noise spectrum of the converted digital signal concentrates on a particular frequency. Hereinafter, a configuration example of the delta-sigma AD converter 16 is explained.

The integrator 13 stores charge sampled based on the analog input signal to a capacitor. The charge sampled based on the analog input signal is output from the subtractor 12 to the integrator 13. The integrator 13 outputs an integration result to the quantizer 14 using the capacitor that stores the charge.

Figure 6:
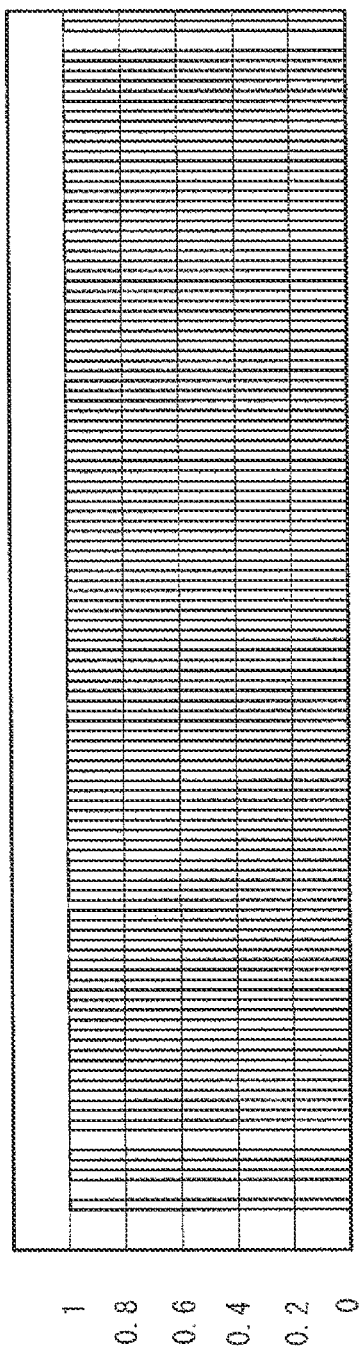
FIG. 6 is a diagram showing compressional waves of a digital pulse according to the first embodiment.

The quantizer 14 has a predetermined threshold. The quantizer 14 outputs the digital signal that is determined whether a value of the integration result output from the integrator 13 exceeds or falls below the threshold. For example, the quantizer 14 generates a 1-bit digital signal when using one threshold. The quantizer 14 outputs the digital signal determined based on the integration result to the decimation filter 17 while feeding back the digital signal to the DA converter 15. FIG. 6 shows an example of the signal output from the quantizer 14. The signal shown in FIG. 6 is illustrated in compressional waves of a digital pulse with the horizontal axis representing time and the vertical axis representing digital values.

The DA converter 15 converts the digital signal output from the quantizer 14 into an analog signal and outputs the analog signal to the subtractor 12. The subtractor 12 subtracts the analog signal output from the DA converter 15 from the added analog signal output from the adder 11. Feeding back the signal output from the quantizer 14 and outputting the signal to the subtractor 12 can reduce the quantization error of the quantizer 14.

Explained below is the decimation filter 17 that performs signal processing on the digital signal output from the delta-sigma AD converter 16. The decimation filter 17 converts a sampling frequency into a desired data rate and generates a digital signal with the desired data rate. The sampling frequency is used by the quantizer 14 to generate the digital signal. The decimation filter 17 may decimate the sampling frequency and generate the digital signal with the desired data rate that has been converted, for example.

Figure 7:
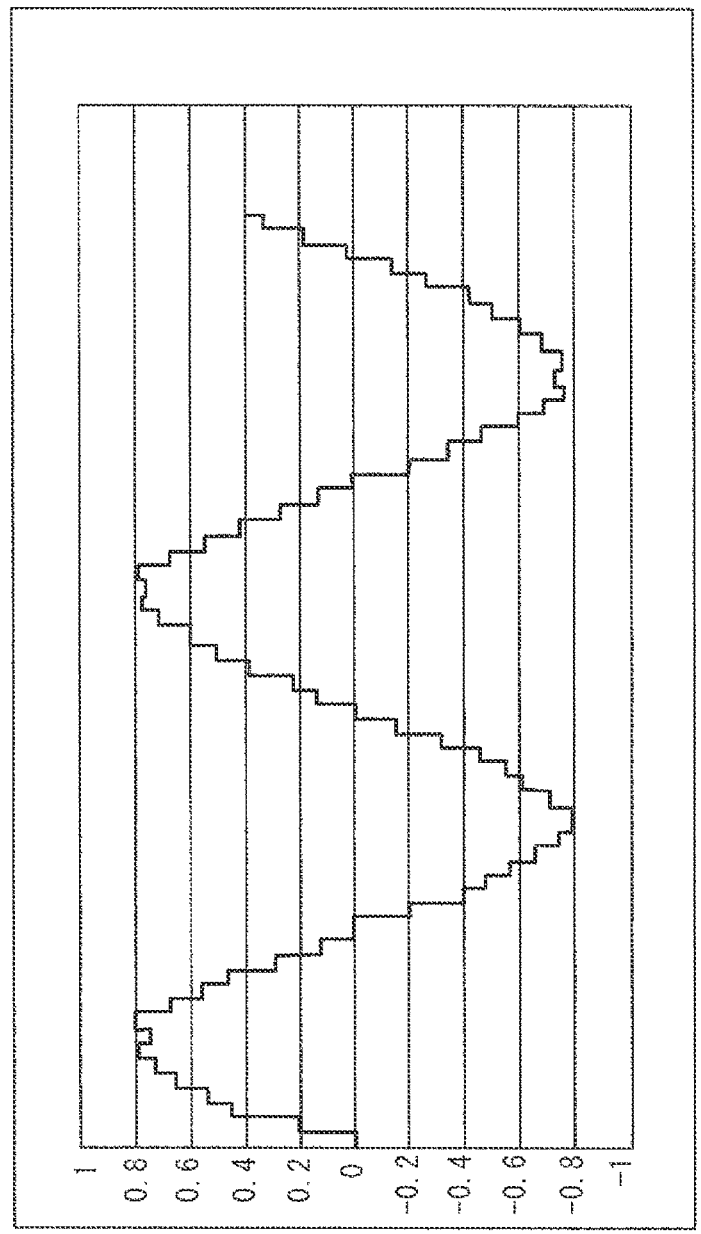
FIG. 7 is a diagram showing a signal output from a decimation filter according to the first embodiment.

Further, the decimation filter 17 may filter, using an HPF, the digital signal with the desired data rate that has been converted. A DC dither signal component is also included in the digital signal generated by the decimation filter 17. A frequency of the DC dither signal component is lower than the frequency of the analog input signal. The decimation filter 17 therefore filters the digital signal using the HPF in order to remove the DC dither signal component. Then, the decimation filter 17 can extract only the component of the analog input signal. FIG. 7 shows an example of the signal output from the decimation filter 17. FIG. 7 shows a digital signal with the same frequency as that of the analog input signal.

The LPF 20 extracts the DC dither signal component from the digital signal output from the delta-sigma AD converter 16. Since the DC dither signal is a direct current signal, the clock frequency is zero or a signal with a frequency closest possible to a low frequency. Accordingly, extracting the low frequency signal using the LPF 20 enables extraction of the DC dither signal component. In other words, the LPF 20 can remove the signal component corresponding to the analog input signal from the digital signal output from the delta-sigma AD converter 16.

The voltage comparison unit 21 compares a voltage value indicated by the DC dither signal component and a voltage value set by the DC dither setting unit 18. The voltage comparison unit 21 outputs a comparison result to the fault detection unit 22.

When the voltage value indicated by the DC dither signal component and the voltage value set by the DC dither setting unit 18 match, the fault detection unit 22 evaluates that the adder 11, the delta-sigma AD converter 16, and the LPF 20 operate normally. When the voltage value indicated by the DC dither signal component and the voltage value set by the DC dither setting unit 18 do not match, the fault detection unit 22 evaluates that at least one of the adder 11, the delta-sigma AD converter 16, and the LPF 20 is not operating normally. Even when the voltage value indicated by the DC dither signal component and the voltage value set by the DC dither setting unit 18 do not match, the fault detection unit 22 may evaluate that the adder 11, the delta-sigma AD converter 16, and the LPF 20 operate normally if a difference between the voltage value indicated by the DC dither signal component and the voltage value set by the DC dither setting unit 18 is within a predetermined range.

As explained above, it is possible to perform the fault evaluation on the semiconductor device by extracting from the digital signal the DC dither signal component that is added before being input to the delta-sigma AD converter 16. The DC dither signal is a known signal added in order to suppress the phenomenon in which the noise spectrum of the converted digital signal concentrates on a particular frequency. Adding the DC dither signal will therefore not impair the characteristics of the AD conversion.

Moreover, the fault detection unit 22 can perform the fault evaluation using the same signal as the digital signal that is output from the quantizer 14 to the decimation filter 17. Hence, the fault detection unit 22 can perform the fault detection on the entire semiconductor device during the AD conversion operation by the delta-sigma AD converter 16 and the decimation filter 17. The entire semiconductor device indicates a configuration including the adder 11, the digital sigma AD converter 16, and the LPF 20, for example.

Second Embodiment

Figure 8:
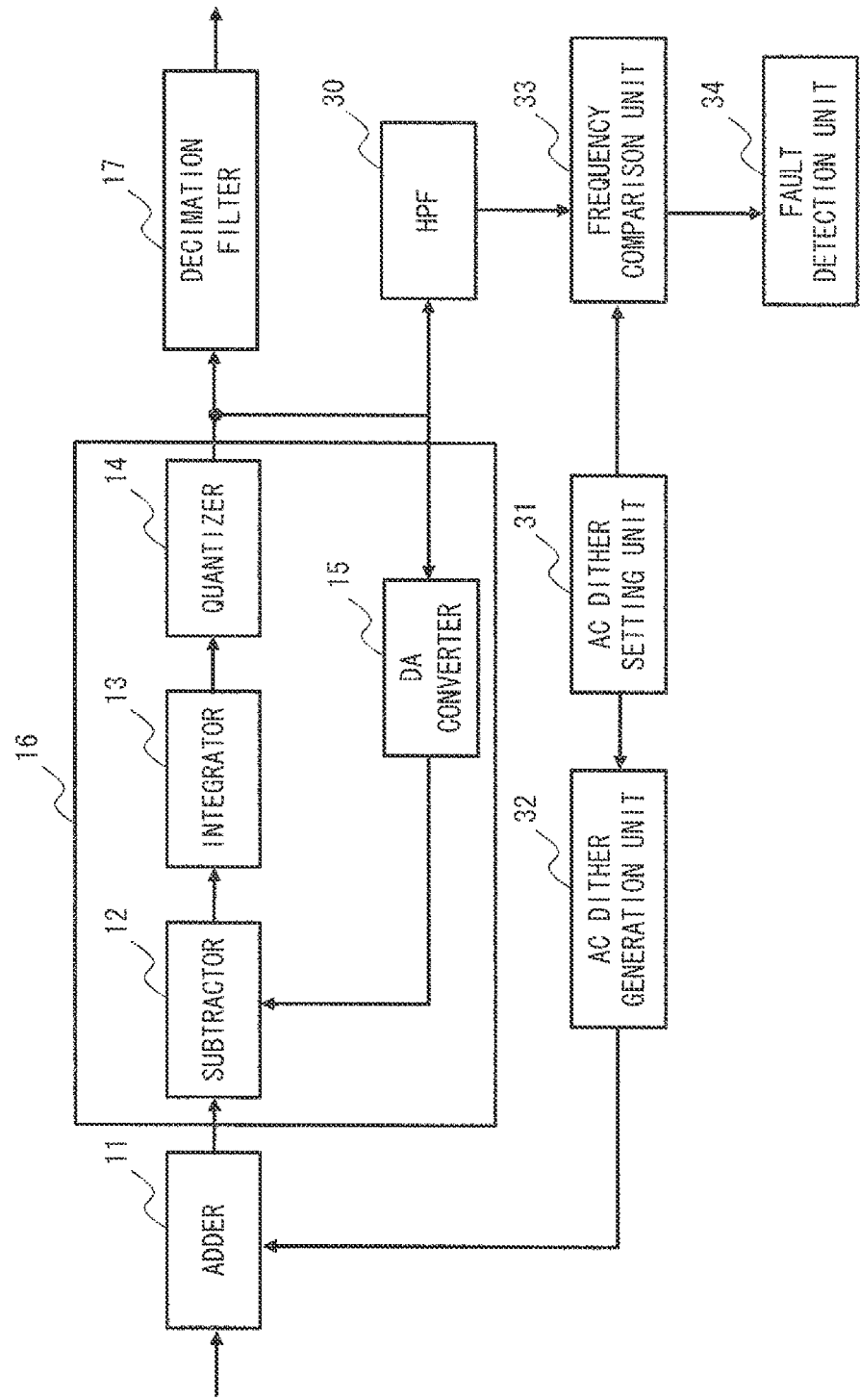
FIG. 8 is a block diagram of a semiconductor device according to a second embodiment.

Next, a configuration example of a semiconductor device according to a second embodiment is explained using FIG. 8. The same components as in FIG. 2 are denoted by the same reference numerals in the following explanation. The semiconductor device shown in FIG. 8 includes the adder 11, the delta-sigma AD converter 16, the decimation filter 17, an HPF 30, an AC dither setting unit 31, an AC dither generation unit 32, a frequency comparison unit 33, and a fault detection unit 34. Explained below is AD conversion of a DC analog signal using the semiconductor device of FIG. 8.

The adder 11 adds the DC analog signal and an AC dither signal and generates an added analog signal. The DC analog signal is a direct current signal indicating a certain voltage value. The AC dither signal is an alternating current signal. The AC dither signal is generated according to an alternating current cycle determined by the AC dither setting unit 31. The AC dither setting unit 31 may further determine amplitude of the AC dither signal together with the alternating current cycle. The AC dither generation unit 32 generates the AC dither signal using setting values such as the alternating current cycle that are determined by the AC dither setting unit 31. The AC dither generation unit 32 outputs the generated AC dither signal to the adder 11. The adder 11 outputs the added analog signal to the delta-sigma AD converter 16.

Since the delta-sigma AD converter 16 has a similar configuration and operates similarly as the delta-sigma AD converter 16 shown in FIG. 2, specific explanation will not be presented here.

The decimation filter 17 converts a sampling frequency of the digital signal output from the delta-sigma AD converter 16 into a desired data rate and generates a digital signal with the desired data rate that has been converted. The sampling frequency is used by the quantizer 14 to generate the digital signal. The decimation filter 17 may decimate the sampling frequency and generate the digital signal with the desired data rate that has been converted, for example.

Further, the decimation filter 17 may filter, using an LPF, the digital signal with the desired data rate that has been converted. An AC dither signal component is also included in the digital signal generated by the decimation filter 17. The frequency of the AC dither signal component is greater than the frequency of the DC analog signal. The decimation filter 17 therefore filters the digital signal using the LPF in order to remove the AC dither signal component. Then, the decimation filter 17 can extract only the digital signal corresponding to the signal component of the DC analog signal.

The HPF 30 extracts the AC dither signal component from the digital signal output from the delta-sigma AD converter 16. The AC dither signal is a signal operating according to a set frequency. The AC dither signal has a clock frequency greater than that of the DC analog input signal, which is a signal with the clock frequency being zero or a signal with a frequency closest possible to a low frequency. Extracting the high frequency signal using the HPF 30 enables extraction of the AC dither signal component. In other words, the HPF 30 can remove the signal component corresponding to the DC analog input signal from the digital signal output from the delta-sigma AD converter 16.

The frequency comparison unit 33 counts both positive and negative values of the digital data of the separated AC dither signal component. The frequency comparison unit 33 calculates an alternating current cycle of the AC dither signal component using the counted value. The frequency comparison unit 33 compares the alternating current cycle of the separated AC dither signal component and an alternating current cycle set by the AC dither setting unit 31. The frequency comparison unit 33 outputs a comparison result to the fault detection unit 34.

When the alternating current cycle of the AC dither signal component and the alternating current cycle set by the AC dither setting unit 31 match, the fault detection unit 34 evaluates that the adder 11, the delta-sigma AD converter 16, and the HPF 30 operate normally. When the alternating current cycle of the AC dither signal component and the alternating current cycle set by the AC dither setting unit 31 do not match, the fault detection unit 34 evaluates that at least one of the adder 11, the delta-sigma AD converter 16, and the HPF 30 is not operating normally. Even when the alternating current cycle of the AC dither signal component and the alternating current cycle set by the AC dither setting unit 31 do not match, the fault detection unit 34 may evaluate that the adder 11, the delta-sigma AD converter 16, and the HPF 30 operate normally if a difference between the alternating current cycle of the AC dither signal component and the alternating current cycle set by the AC dither setting unit 31 is within a predetermined range.

As explained above, extracting the AC dither signal component added before being input to the delta-sigma AD converter 16 enables the fault evaluation to be performed on the semiconductor device. The AC dither signal is a known signal added in order to suppress the phenomenon in which the noise spectrum of the converted digital signal concentrates on a particular frequency. Adding the AC dither signal will therefore not impair the characteristics of the AD conversion.

Moreover, the fault detection unit 34 can perform the fault evaluation using the same signal as the digital signal that is output from the quantizer 14 to the decimation filter 17. Hence, the fault detection unit 34 can perform fault detection on the entire semiconductor device during the AD conversion operation by the delta-sigma AD converter 16 and the decimation filter 17. The entire semiconductor device indicates a configuration including the adder 11, the digital sigma AD converter 16, and the HPF 30, for example.

Third Embodiment

Figure 9:
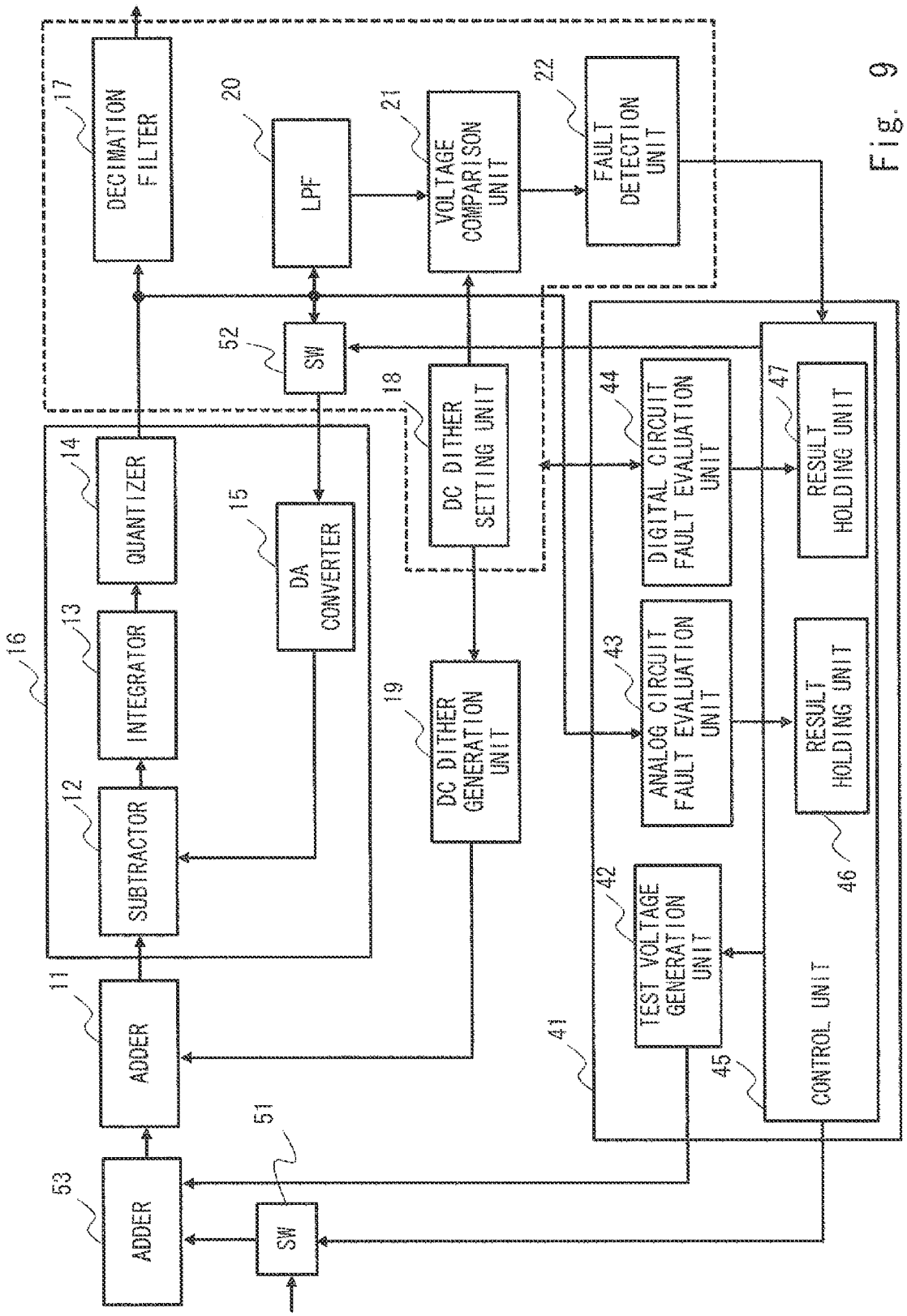
FIG. 9 is a block diagram of a semiconductor device according to a third embodiment.

Next, a configuration example of a semiconductor device according to a third exemplary embodiment is explained using FIG. 9. The semiconductor device of FIG. 9 has a configuration of FIG. 2 further including a fault diagnosis control unit 41, SW51, SW52, and an adder 53. The fault diagnosis control unit 41 includes a test voltage generation unit 42, an analog circuit fault evaluation unit 43, a digital circuit fault evaluation unit 44, a control unit 45, an analog circuit fault evaluation result holding unit 46, and a digital circuit fault evaluation result holding unit 47. In FIG. 9, the explanation is focused on different components from FIG. 2. The same components as in FIG. 2 are denoted by the same reference numerals in the following explanation.

The adder 53 receives an analog input signal via the SW51. The SW51 are turned ON and OFF in response to a control signal output from the control unit 45. The adder 53 outputs to the adder 11 the analog input signal or a test analog input signal output from the test voltage generation unit 42.

The quantizer 14 feeds back the digital signal to the DA converter 15 via the SW52. The SW52 is turned ON and OFF in response to the control signal output from the control unit 45.

Next, a configuration example of the fault diagnosis control unit 41 is explained. The control unit 45 controls the SW51 and SW52 to be turned OFF from ON when notified with information indicating that a fault is detected from the fault detection unit 22.

In response to the notification indicating that a fault is detected from the fault detection unit 22, the digital circuit fault evaluation unit 44 tests a digital unit that performs digital signal processing. The digital unit includes the decimation filter 17, the DC dither setting unit 18, the LPF 20, the voltage comparison unit 21, and the fault detection unit 22. For example, the digital circuit fault evaluation unit 44 supplies a test pattern to the digital unit and performs a scan test. The digital circuit fault evaluation unit 44 evaluates whether or not a fault is present in the digital unit based on output values output from each of the components in the digital unit. The digital circuit fault evaluation unit 44 stores a test result to the digital circuit fault evaluation result holding unit 47. The digital circuit fault evaluation result holding unit 47 may be configured using a register.

The test voltage generation unit 42 outputs a test voltage signal to the adder 53. The SW51 is turned OFF by the control of the control unit 45. Thus, the adder 53 outputs the test voltage signal output from the test voltage generation unit 42 to the adder 11. The test voltage signal added with the DC dither signal is input to the integrator 13. At this time, the SW52 is turned OFF by the control unit 45. Therefore, no feedback signal is output to the DA converter 15 and the subtractor 12. The integrator 13 integrates the test voltage signal that is added with the DC dither signal. The integrator 13 outputs an integration result to the quantizer 14.

Figure 10:
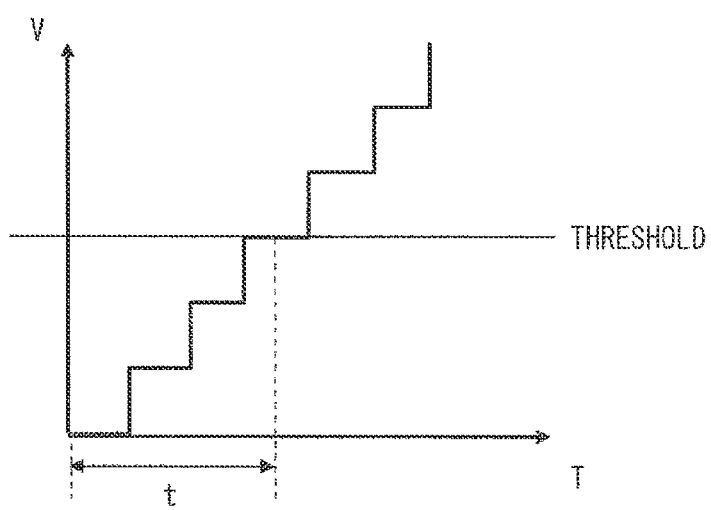
FIG. 10 is a diagram showing a timing at which an output from a quantizer is inverted.

The quantizer 14 receives the integration result. As shown in FIG. 10, the quantizer 14 receives the integration result for a certain time, and when the integration result exceeds a predetermined threshold, an output signal from the quantizer 14 is inverted. The analog circuit fault evaluation unit 43 measures the time t until the output from the quantizer 14 is inverted. When the time t until the output from the quantizer 14 is inverted is different from the time set as an expected value, the analog circuit fault evaluation unit 43 evaluates that a fault is present in at least one of the integrator 13 and the quantizer 14. When the time t until the output from the quantizer 14 is inverted is the same as the time set as the expected value, the analog circuit fault evaluation unit 43 evaluates that no fault is present in the integrator 13 and the quantizer 14.

The analog circuit fault evaluation unit 43 may make a following evaluation even when the time t until the output from the quantizer 14 is inverted is different from the time set as the expected value. Specifically, when a difference between the time t until the output from the quantizer 14 is inverted and the time set as the expected value is within a predetermined range, the analog circuit fault evaluation unit 43 may evaluate that no fault is present in the integrator 13 and the quantizer 14.

The analog circuit fault evaluation unit 43 stores a test result to the analog circuit fault evaluation result holding unit 46. The analog circuit fault evaluation unit 43 may be configured using a register.

Subsequently, a flow of a fault diagnosis process in the fault diagnosis control unit 41 is explained using FIG. 11. First, the control unit 45 evaluates whether or not information indicating that a fault is detected is notified from the fault detection unit 22 (S11). When the control unit 45 evaluates that the information indicating that a fault is detected is not notified from the fault detection unit 22, the control unit 45 repeats the process of S11. When the control unit 45 evaluates that the information indicating that a fault is detected is notified from the fault detection unit 22, the control unit 45 stops the AD conversion operation by the delta-sigma AD converter 16 (S12). For example, the control unit 45 controls the SW51 and SW52 to be turned OFF. When the SW51 is turned OFF, the analog input signal is not supplied to the delta-sigma AD converter 16.

Next, the digital circuit fault evaluation unit 44 tests the digital unit (S13). For example, the digital circuit fault evaluation unit 44 may test the digital unit by the scan test. Next, the digital circuit fault evaluation unit 44 evaluates whether or not a fault is present in the digital unit (S14). Upon detection of the fault as a result of the test, the digital circuit fault evaluation unit 44 evaluates that the fault is present in at least one of functional blocks composing the digital unit (S15). When the digital circuit fault evaluation unit 44 did not detect the fault, the test voltage generation unit 42 outputs the test voltage signal to the adder 53 (S16).

Next, the analog circuit fault evaluation unit 43 evaluates whether or not the time t until the output from the quantizer 14 is inverted is same as the expected value after receiving the test voltage (S17). When the time t until the output from the quantizer 14 is inverted is different from the expected value, the analog circuit fault evaluation unit 43 evaluates that a fault is present in at least one of the integrator 13 and the quantizer 14 (S18). When the time t until the output from the quantizer 14 is inverted is same as the expected value, the analog circuit fault evaluation unit 43 evaluates that no fault is present in the delta-sigma AD converter 16 (S19). In other words, the analog circuit fault evaluation unit 43 evaluates that the fault is present in the block other than the delta-sigma AD converter 16.

As explained above, the fault diagnosis control unit 41 enables identification of the fault location in one of the digital unit and the delta-sigma AD converter 16.

Further, a location of the fault may be identified using a configuration different from the abovementioned configuration. For example, the test voltage generation unit 42 may output the test voltage to the DA converter 15. In this case, the test voltage generation unit 42 outputs the digital signal to the DA converter 15. The quantizer 14 outputs a quantization result to the analog circuit fault evaluation unit 43 based on the test voltage signal output from the DA converter 15. Such a configuration enables the analog circuit fault evaluation unit 43 to detect a fault in the DA converter 15 in addition to a fault in the integrator 13 and the quantizer 14.

The location of the fault may be identified using a configuration further different from the abovementioned configuration. For example, the control unit 45 may control only the SW51 to be turned OFF and leave the SW52 ON. Then, the decimation filter 17 outputs the AD conversion result using the test voltage signal output from the test voltage generation unit 42. The analog circuit fault evaluation unit 43 or the control unit 45 may evaluate whether or not the AD conversion is performed normally by comparing the AD conversion result output from the decimation filter 17 with the test voltage signal output from the test voltage generation unit 42.

Figure 11:
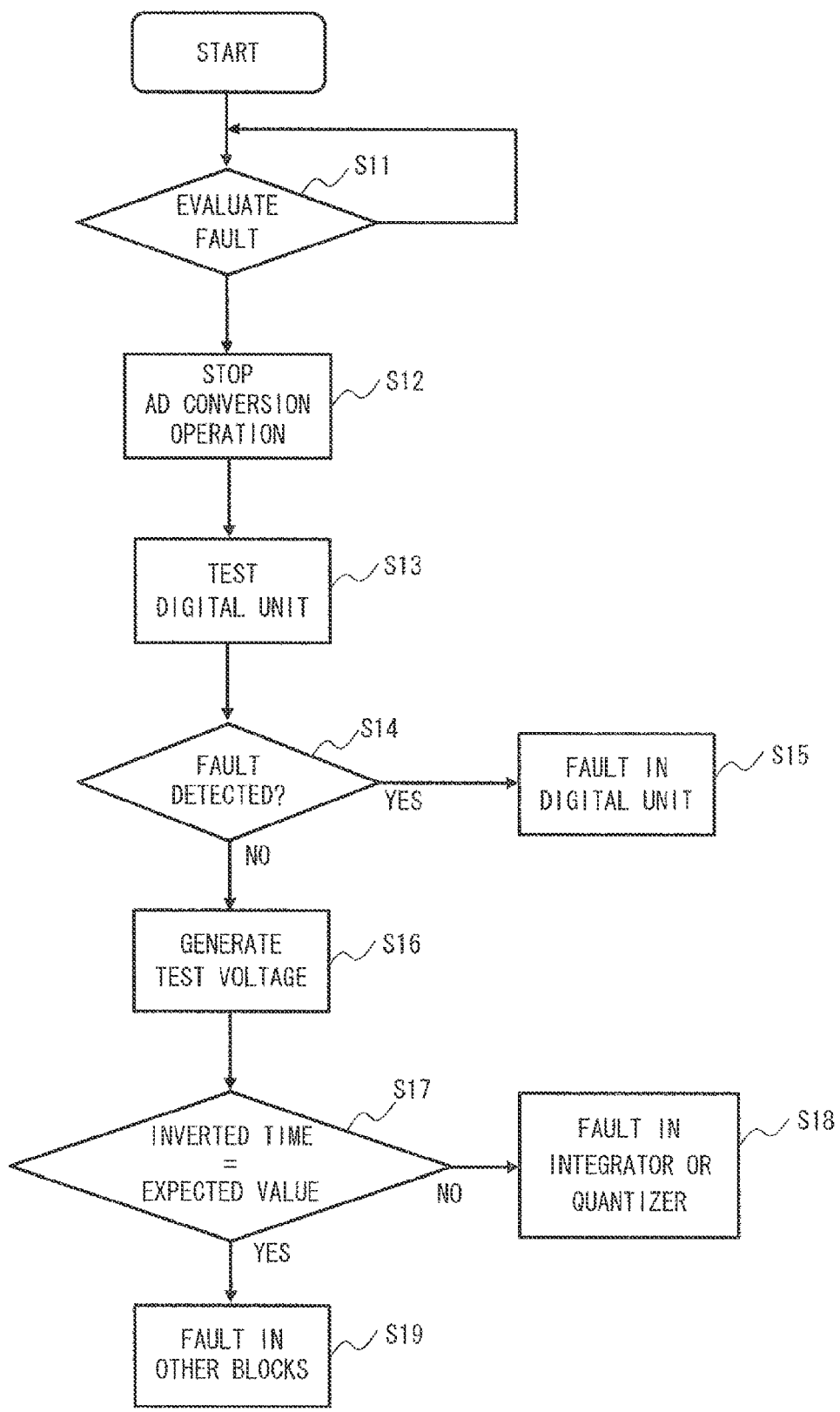
FIG. 11 is a diagram showing a flow of a fault diagnosis process according to the third embodiment.

The AD conversion result output from the decimation filter 17 may be compared with the test voltage signal output from the test voltage generation unit 42 after determination is made that no fault is present in the digital unit (on and after the step S14:NO in FIG. 11). In this case, as it has been evaluated that no fault is present in the decimation filter 17, the decimation filter 17 can be excluded from the location of the fault. That is, the location of the fault can be evaluated as the delta-sigma AD converter 16 or other blocks.

Fourth Embodiment

Figure 12:
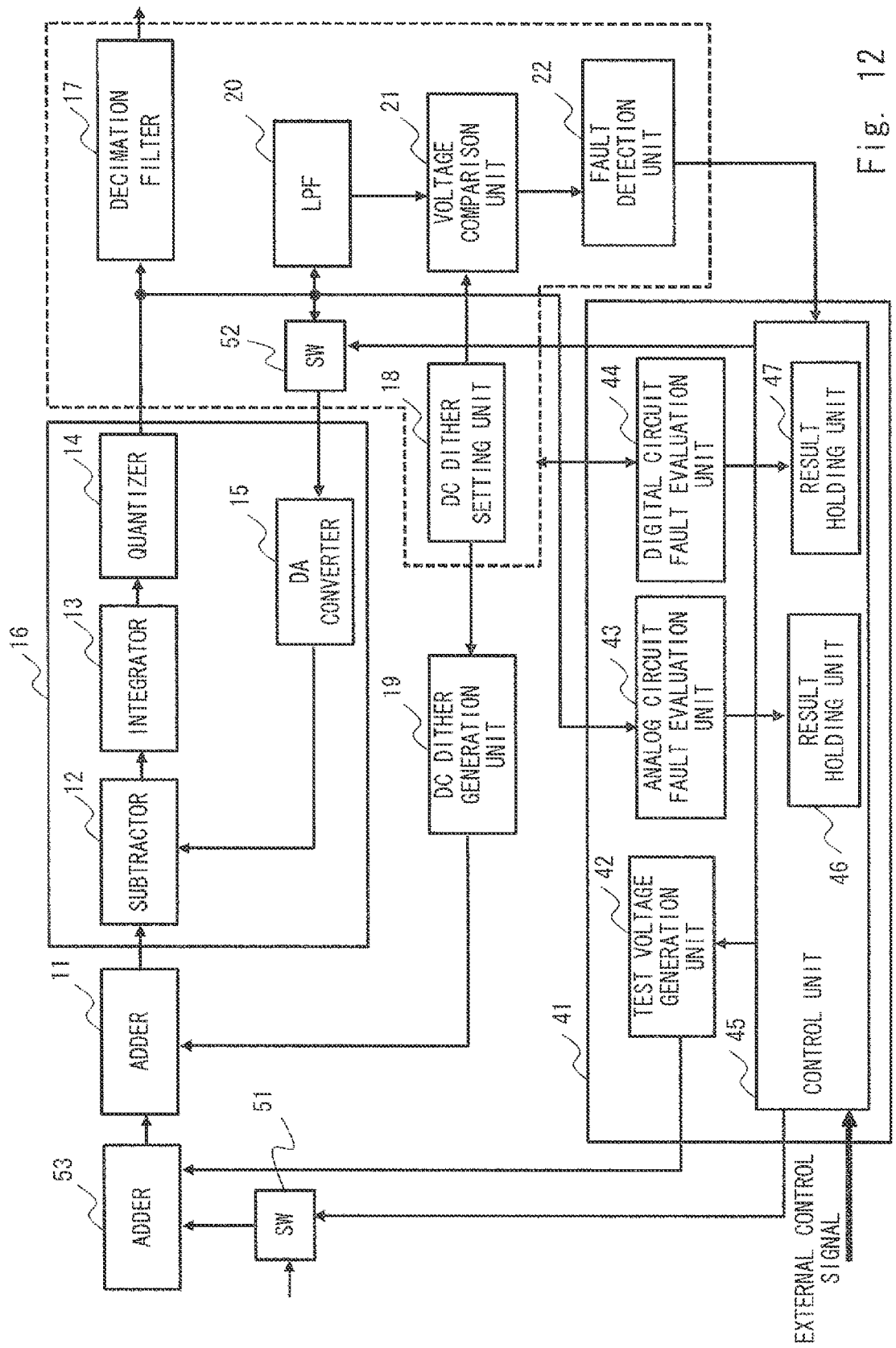
FIG. 12 is a block diagram of a semiconductor device according to a fourth embodiment.

Next, a configuration example of a semiconductor device according to a fourth embodiment is explained using FIG. 12. The semiconductor device of FIG. 12 receives an external control signal output from an external device such as a different semiconductor device or an external circuit to the control unit 45 of the fault diagnosis control unit 41 in the semiconductor device of FIG. 9.

For example, when the semiconductor device according to the fourth embodiment is used in a car, the external control signal may be used to notify the control unit 45 that an engine operation has stopped. While the engine operation stops in this way, the AD conversion operation by the delta-sigma AD converter 16 and the decimation filter 17 also stops. Alternatively, the control unit 45 may control the AD conversion operation to stop upon receipt of the external control signal. While the AD conversion operation stops, the fault detection by the fault detection unit 22, the fault detection unit 34 and the like, and the identification of the location of the fault by the fault diagnosis control unit 41 will not be performed.

In this regard, explained below is the control of the fault detection on the delta-sigma AD converter 16 and the digital unit while the AD conversion operation stops. For example, upon receipt of the external control signal indicating that the engine operation has stopped, the control unit 45 may transition to a test mode for performing the fault detection while the AD conversion stops. In the test mode, the test voltage generation unit 42 periodically generates the test voltage and outputs the test voltage to the adder 53. This enables periodical operation of the delta-sigma AD converter 16 and the digital unit, thereby performing the AD conversion operation. The fault diagnosis control unit 41 may detect whether or not a fault is present in the delta-sigma AD converter 16 and the digital unit in this way.

As explained above, when the AD conversion operation stops, the fault diagnosis control unit 41 can periodically perform the fault detection on the delta-sigma AD converter 16 and the digital unit by transitioning to the test mode. Therefore, a fault in the units relating to the AD conversion operation can be detected previously before starting the engine operation.

In the above explanation, although the external control signal has been explained as a signal for notifying that the engine operation has stopped, the external control signal is not limited to this. For example, when an electronic device or an electronic apparatus, for example, continues to deny an operation from a user for a certain time, the external control signal may be used to notify that the electronic device and the like is not operating.

Although the invention made by the present inventor has been explained in detail based on the embodiments, it is obvious that the present invention is not limited to the above embodiments, but various modifications can be made within the scope of the present invention.

The whole or part of the embodiments disclosed above can be described as, but not limited to, the following supplementary note. (Supplementary note 1) A semiconductor device comprising:

an analog circuit fault evaluation unit that outputs a test analog signal to an analog to digital conversion unit and detects a fault in the analog to digital conversion unit, the analog to digital conversion unit converting a second analog signal into a first digital signal, the second analog signal being obtained by adding a first analog signal and an offset signal with a signal band different from the first analog signal; and a digital circuit fault evaluation unit that outputs a test digital signal to a signal extraction unit and a fault detection unit and detects a fault in the signal extraction unit and the fault detection unit, the signal extraction unit extracting from the first digital signal a second digital signal corresponding to the signal band of the offset signal, and the fault detection unit detecting the fault in the analog to digital conversion unit based on the second digital signal and a setting value set upon generating the offset signal.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first to fourth embodiments can be combined as desirable by one of ordinary skill in the art.

What is claimed is:

1. A semiconductor device comprising:
an analog to digital conversion unit that converts a second analog signal into a first digital signal, the second analog signal being obtained by adding a first analog signal and an offset signal with a signal band different from the first analog signal;
a signal extraction unit that extracts a second digital signal from the first digital signal, the second digital signal corresponding to the signal band of the offset signal; and
a fault detection unit that detects a fault in the analog to digital conversion unit based on the second digital signal and a setting value, the setting value being set upon generating the offset signal.

2. The semiconductor device according to claim 1, wherein the analog to digital conversion unit adds, as a feedback signal, a signal obtained by converting the first digital signal into an analog signal to the second analog signal.

3. The semiconductor device according to claim 1, wherein the fault detection unit detects the fault in the analog to digital conversion unit according to a comparison result indicating a result of comparing the second digital signal and the setting value set upon generating the offset signal.

4. The semiconductor device according to claim 1, wherein the analog to digital conversion unit comprises:
an adder that adds the first analog signal and the offset signal and generates the second analog signal;
a delta-sigma analog to digital conversion unit that quantizes the second analog signal and generates the first digital signal; and
a decimation filter that extracts from the first digital signal a third digital signal corresponding to a signal band of the first analog signal.

5. The semiconductor device according to claim 1, wherein when the first analog signal is an alternating current signal and the offset signal is a direct current signal, a low-pass filter, as the signal extraction unit, extracts the second digital signal.

6. The semiconductor device according to claim 5, wherein the fault detection unit compares a voltage value of the second digital signal with a voltage value set upon generating the offset signal and detects the fault in the analog to digital conversion unit according to a comparison result.

7. The semiconductor device according to claim 1, wherein when the first analog signal is a direct current signal and the offset signal is an alternating current signal, a high-pass filter, as the signal extraction unit, extracts the second digital signal.

8. The semiconductor device according to claim 7, wherein the fault detection unit compares a cycle of the second digital signal and a cycle set upon generating the offset signal and detects the fault in the analog to digital conversion unit according to a comparison result.

9. The semiconductor device according to claim 1, further comprising a dither signal generation unit that generates a dither signal, wherein the offset signal is the dither signal.

10. The semiconductor device according to claim 4, further comprising:
a digital signal test unit that supplies a test pattern to a digital signal processing unit and performs a test, the digital signal processing unit including the decimation filter, the signal extraction unit, and the fault detection unit; and
a digital signal test result holding unit that holds a test result of the digital signal processing unit.

11. The semiconductor device according to claim 4, further comprising:
an analog signal test unit that supplies a test signal to an analog signal processing unit and performs a test, the analog signal processing unit including the adder and the delta-sigma analog to digital conversion unit; and
an analog signal test result holding unit that holds a test result of the analog signal processing unit.

12. The semiconductor device according to claim 11, wherein
upon receipt of an external control signal indicating an operation stop of the analog digital conversion unit, the analog signal test unit periodically supplies the test signal to the analog signal processing unit and performs the test.

13. A semiconductor device comprising:
a signal extraction unit that extracts a second digital signal from a first digital signal, the first digital signal being converted from a second analog signal, the second analog signal being obtained by adding a first analog signal and an offset signal with a signal band different from the first analog signal, and the second digital signal corresponding to the signal band of the offset signal; and
a fault detection unit that detects a fault in an analog to digital conversion unit based on the second digital signal and a setting value set upon generating the offset signal, the analog to digital conversion unit converting the second analog signal into the first digital signal.

14. The semiconductor device according to claim 13, wherein the fault detection unit detects the fault in the analog to digital conversion unit according to a comparison result indicating a result of comparing the second digital signal and the setting value set upon generating the offset signal.

15. The semiconductor device according to claim 13, wherein when the first analog signal is an alternating current signal and the offset signal is a direct current signal, a low-pass filter, as the signal extraction unit, extracts the second digital signal.

16. The semiconductor device according to claim 15, wherein the fault detection unit compares a voltage value of the second digital signal with a voltage value set upon generating the offset signal and detects the fault in the analog to digital conversion unit according to a comparison result.

17. The semiconductor device according to claim 13, wherein when the analog signal is a direct current signal and the offset signal is an alternating current signal, a high-pass filter, as the signal extraction unit, extracts the second digital signal.

18. The semiconductor device according to claim 17, wherein the fault detection unit compares a cycle of the second digital signal with a cycle set upon generating the offset signal and detects the fault in the analog to digital conversion unit according to a comparison result.

19. A fault diagnosis system comprising:
a semiconductor device comprising:
an analog to digital conversion unit that converts a second analog signal into a first digital signal, the second digital signal being obtained by adding a first analog signal and an offset signal with a signal band different from the first analog signal;
a signal extraction unit that extracts a second digital signal from the first digital signal, the second digital signal corresponding to the signal band of the offset signal; and
a fault detection unit that detects a fault in the analog to digital conversion unit based on the second digital signal and a setting value, the setting value being set upon generating the offset signal; and a fault diagnosis control unit comprising:
- an analog circuit fault evaluation unit that outputs a test analog signal to the analog to digital conversion unit and detects the fault in the analog to digital conversion unit; and
- a digital circuit fault evaluation unit that outputs a test digital signal to the signal extraction unit and the fault detection unit and detects a fault in the signal extraction unit and the fault detection unit.

* * * * *